United States Patent
Tränkle et al.

(10) Patent No.: US 8,824,518 B2
(45) Date of Patent: Sep. 2, 2014

(54) TWO-CAVITY SURFACE-EMITTING LASER

(75) Inventors: Günther Tränkle, Berlin (DE); Joachim Piprek, Newark, DE (US); Hans Wenzel, Berlin (DE); Götz Erbert, Berlin (DE); Markus Weyers, Wildau (DE); Andrea Knigge, Königs Wusterhausen (DE)

(73) Assignee: Forschungsverbund Berlin e.V., Berlin (DE)

( * ) Notice: Subject to any disclaimer, the term of this patent is extended or adjusted under 35 U.S.C. 154(b) by 0 days.

(21) Appl. No.: 12/968,727

(22) Filed: Dec. 15, 2010

(65) Prior Publication Data

US 2011/0228805 A1  Sep. 22, 2011

Related U.S. Application Data

(60) Provisional application No. 61/287,259, filed on Dec. 17, 2009.

(30) Foreign Application Priority Data

Jun. 10, 2010  (EP) ..................................... 10165592

(51) Int. Cl.
| | |
|---|---|
| H01S 5/183 | (2006.01) |
| H01S 5/14 | (2006.01) |
| H01S 5/04 | (2006.01) |
| H01S 5/026 | (2006.01) |
| H01S 5/40 | (2006.01) |

(52) U.S. Cl.
CPC ............... *H01S 5/183* (2013.01); *H01S 5/4087* (2013.01); *H01S 5/041* (2013.01); *H01S 5/026* (2013.01); *H01S 5/14* (2013.01); *H01S 5/4025* (2013.01)
USPC .............................. 372/50.11; 372/97; 372/72

(58) Field of Classification Search
USPC ............................................ 372/50.11, 97, 72
See application file for complete search history.

(56) References Cited

U.S. PATENT DOCUMENTS 6,535,541 B1 * 3/2003 Boucart et al. .................. 372/96
(Continued)

FOREIGN PATENT DOCUMENTS

| DE | 101 29 616 A1 | 1/2003 |
|---|---|---|
| DE | 102 43 545 A1 | 4/2004 |

(Continued)

OTHER PUBLICATIONS

Michael D. Gerhold et al. "Novel Design of a Hybrid-Cavity Surface-Emitting Laser", IEEE Journal of Quantum Electronic, vol. 34, No. 3, pp. 506-511, Mar. 3, 1998.

*Primary Examiner* — Tod T Van Roy
*Assistant Examiner* — Marcia Golub-Miller
(74) *Attorney, Agent, or Firm* — Norris McLaughlin & Marcus, P.A.

(57) ABSTRACT

A the vertical-cavity surface-emitting laser includes a stripe-shaped active medium (10) having an emission maximum at a first wavelength ($\lambda 1$), wherein a first reflector (18) is arranged below the stripe-shaped active medium (10) and a second reflector (20) is arranged above the stripe-shaped active medium (10), with the first reflector (18) facing the second reflector (20), wherein the first reflector (18) and a second reflector (20) have a reflectivity maximum in the region of the first wavelength ($\lambda 1$), wherein a third reflector (12) and a fourth reflector (13) are each arranged on a side above or next to the stripe-shaped active medium (10), wherein the third reflector (12) faces the fourth reflector (13), and wherein the third reflector (12) and the fourth reflector (13) have a reflectivity maximum in the region of a second wavelength ($\lambda 2$), wherein the first wavelength ($\lambda 1$) is greater than the second wavelength ($\lambda 2$).

14 Claims, 13 Drawing Sheets

(56) References Cited

U.S. PATENT DOCUMENTS

Figure 1:
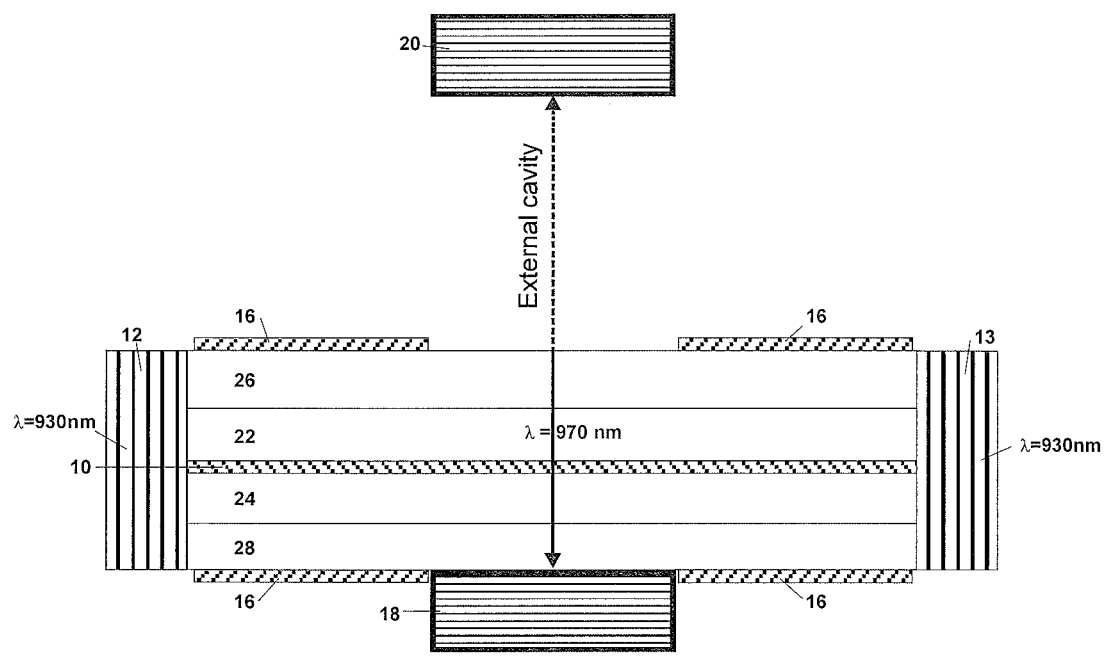

| | | | |
|---|---|---|---|
| 7,113,526 B2 * | 9/2006 | Evans et al. | 372/23 |
| 7,551,660 B2 * | 6/2009 | Lutgen | 372/50.124 |
| 7,653,113 B2 * | 1/2010 | Lee et al. | 372/72 |
| 2002/0001328 A1 * | 1/2002 | Albrecht et al. | 372/50 |
| 2002/0075935 A1 * | 6/2002 | Clayton | 372/75 |
| 2004/0141538 A1 * | 7/2004 | Schmid et al. | 372/70 |

FOREIGN PATENT DOCUMENTS

| | | |
|---|---|---|
| DE | 10 2006 011284 A1 | 8/2007 |
| EP | 1 605 562 A2 | 12/2005 |
| EP | 1 906 497 A1 | 4/2008 |

* cited by examiner

TWO-CAVITY SURFACE-EMITTING LASER

The present invention relates to a surface-emitting laser radiation source consisting of a vertical resonator (Vertical-Cavity Surface-Emitting Laser, VCSEL) and a monolithically integrated pump resonator (Two-Cavity Surface-Emitting Laser, TCSEL) which is arranged perpendicular thereto in the plane of the semiconductor layers.

A VCSEL is a semiconductor laser, wherein the light is emitted perpendicular to the plane of the semiconductor chip and the active layer, respectively, as opposed to conventional edge emitters where the light exits from one or two edges of the chip. In a conventional VCSEL, the laser resonator is formed by two DBR (Distributed Bragg-Reflector) mirrors, subsequently also referred to as Bragg-Reflector, between which an active medium—typically with one or several quantum well structures—is embedded for producing the laser light. Such planar DBR mirrors are constructed from layers having alternatingly low and high refractive indices, each layer having an optical thickness of one quarter of the laser wavelength (resonance wavelength of the vertical cavity) in the material ($\lambda/4$). In this way, reflectivities of greater than 99% required for a VCSEL are realized. Due to the typically small dimensions of the actual laser of only several micrometers in each direction, VCSELs have smaller output powers compared to edge emitters. Both optically pumped VCSELs, wherein the active zone is externally excited by light of shorter wavelength to emit radiation, as well as electrically pumped VCSELs representing a p-i-n diode are known in the art. VCSELs for wavelengths between 650 nm and 1200 nm are typically based on GaAs wafers, whereas for wavelengths between 1200 nm and 2000 nm at least the active layer (active zone) is based on GaInAsP or GaInAsN.

It is therefore an object of the present invention to provide a VCSEL with a larger emitting surface and hence higher output powers as compared to conventional VCSELs. Because a larger emitting surface is more difficult to electrically pump, the TCSEL according to the invention is designed to be pumped optically by an integrated horizontal laser having a wavelength defined by an applied grating (for example, a DBR laser), which is in turn electrically pumped. Compared to conventional VECSELs (vertical-external-cavity surface-emitting laser), which are optically pumped vertically, the TCSEL according to the invention has a simpler pump geometry and more particularly a higher efficiency due to a longer absorption length and smaller quantum defect. The emitted laser radiation of the TCSEL according to the invention should also have an improved beam quality compared to edge emitters, a more symmetric beam profile, and a high surface area scalability. In addition, the TCSEL according to the invention should be readily usable in an external resonator.

These objects are attained with the invention with a TCSEL having the features recited in claim 1. Preferred embodiments of the invention are recited in the dependent claims.

The TCSEL according to the invention has a stripe-shaped active medium capable of producing stimulated emission over a wide wavelength range, in a concrete embodiment at a first wavelength (laser wavelength) and a second wavelength (pump wavelength). For forming an integrated vertical cavity, a first reflector is disposed below the stripe-shaped active medium and a second reflector above the stripe-shaped active medium, wherein the first reflector faces the second reflector and the first reflector and the second reflector have a high reflectivity in the region of the first wavelength. For forming an integrated pump laser cavity, a third reflector and a fourth reflector are provided, which are arranged (preferably, each on a respective side of the second reflector) above or next to the stripe-shaped active medium, wherein the third reflector faces the fourth reflector, and wherein the third reflector and the fourth reflector have a reflectivity maximum in the region of a second wavelength (pump wavelength), wherein the laser wavelength is greater than the pump wavelength.

Preferably, at least one of the reflectors is constructed as a Bragg reflector. In a particularly preferred embodiment, all reflectors are constructed as Bragg reflectors. Alternatively, the reflectors may also be formed by different types of reflectors. Stated differently, a reflector which will subsequently be referred to as Bragg reflector may also formed by other types of reflectors. For example, the second reflector need not be a Bragg reflector, but may instead be replaced by a metal. Preferably, the second (Bragg) reflector may be constructed from several individual optical elements, e.g., a simple mirror (mirror layer) and additionally a Bragg reflector for the external VCSEL cavity. In another preferred embodiment, the reflectivity of the third (Bragg) reflector and the fourth (Bragg) reflector may be increased or decreased by applying an additional coating on the planar semiconductor edges. Alternatively, the horizontal pump laser may also be implemented as a DFB (Distributed Feed Back) laser. The third Bragg reflector and the fourth Bragg reflector then extend over the entire electrically pumped region of the pump cavity.

The idea of the invention is to form an additional integrated (horizontal) pump cavity in addition to the conventional vertical cavity, wherein the pump cavity is defined by two additional Bragg reflectors. By combining the two cavities and with a suitable selection of the wavelength, a TCSEL with a particularly high efficiency can be realized. Advantageously, with the integration of horizontal mirrors, a single active medium can be used to generate both the pump radiation and the long-wavelength VCSEL radiation. The active medium may consist of an active layer with one or preferably several quantum wells, or of several, identical or preferably different active layers which each have one or preferably several quantum wells, wherein the quantum wells are preferably arranged at the intensity maxima of the cavity.

Preferably, the uniformity of the active layers extends over the length of those active layers that are disposed between the first and the second reflector (also between the third and the fourth reflector), more preferably over their entire area. Uniformity of the active layer in the context of the present application specifies that the layer parameters (such as chemical composition, doping, layer thickness) deviate by less than 10% across the aforementioned area in relative terms (maximum to minimum).

Moreover, the energy position of the amplification maximum of the active medium in the pump laser may be shifted relative to the energy position of the amplification maximum of the active medium in the VCSEL, for example by thermal post-processing.

In particular, the laser wavelength (first wavelength) is greater than the pump wavelength (second wavelength). This is preferably achieved by a suitable design of the four planar DBR mirrors in that the two VCSEL-DBR mirrors (first Bragg reflector and second Bragg reflector) have their maximum reflectivity in the region of the VCSEL wavelength, whereas the pump-DBR mirrors (third Bragg reflector and fourth Bragg reflector) have their maximum reflectivity in the region of the (shorter) pump wavelength.

Preferably, the difference between the first wavelength and the second wavelength is between 5 nm and 200 nm, more preferred between 10 nm and 100 nm, still more preferred between 20 nm and 45 nm. Preferably, the difference of the photon energy between the pump radiation and the usable vertically emitted laser radiation is less than 5%.

To prevent an undesirable feedback between the pump-DBR mirrors and the photons in the vertical cavity (at the VCSEL wavelength), the bandwidth of the pump-DBR mirrors where the reflectivity is greater than 50% of the maximum reflectivity, is preferably less than 30 nm, more preferably less than 10 nm, more preferable 5 nm, and still more preferably less than 3 nm.

Preferably, the first Bragg reflector and the second Bragg reflector each have a reflectivity for the first wavelength greater than 99%, still more preferred greater than 99.8%. Preferably, the first Bragg reflector and the second Bragg reflector have their maximum reflectivity at the first wavelength. Preferably, the reflectivity of the first Bragg reflector for the first wavelength is greater than the reflectivity of the second Bragg reflector for the second wavelength. In this way, the VCSEL radiation is coupled out via the second Bragg reflector.

Preferably, the third Bragg reflector and the fourth Bragg reflector each have a reflectivity for the second wavelength of greater than 60%, still more preferred greater than 80%, still more preferred greater than 99.9%. Preferably, the reflectivity of the third Bragg reflector with respect to the second wavelength is identical to the reflectivity of the fourth Bragg reflector. Preferably, the third Bragg reflector and the fourth Bragg reflector have their maximum reflectivity at the second wavelength. To adapt the reflectivity of the third and fourth Bragg reflector, additional dielectric mirror layers or antireflective layers may be deposited on the planar edges of the semiconductor.

Preferably, the VCSEL is built on a GaAs-based wafer. The stripe-shaped active medium has preferably one or several layers with thicknesses between 3 nm and 100 nm, more preferably between 5 nm and 10 nm, and a length between 250 µm and 2500 µm, more preferably between 1000 µm and 2000 µm.

The region between the VCSEL-BBR mirrors which is only optically pumped has preferably a length between 500 µm and 100 µm, preferably between 250 µm and 150 µm. The preferably electrically pumped region which directly adjacent on both sides and which is located between the pump-DBR mirrors, but not between the VCSEL-BBR mirrors, has preferably a length between 700 µm and 2000 µm, more preferred between 1000 µm and 1500 µm. The width of the electrically pumped region is preferably between 500 µm and 100 µm, more preferred between 250 µm and 150 µm.

Preferably, the third Bragg reflector in the fourth Bragg reflector are disposed directly adjacent to the stripe-shaped active medium or are arranged above the stripe shaped active medium.

Preferably, the top side of the stripe-shaped active medium directly contacts a first layer made from a semiconducting material, whereas the bottom side directly contacts a second layer made from a semiconducting material. The first semiconducting layer and the second semiconducting layer are doped with opposite polarity, wherein both the first semiconducting layer and the second semiconducting layer may be fabricated from several individual layers. Preferably, contacts for injection of carriers are provided on the semiconductor surface in the entire electrically pumped region of the active medium, i.e., between the pump-DBR mirrors, but not in the region of the second VCSEL-BBR mirror. A full-area contact is preferably applied on the bottom side of the semiconductor.

In a particularly preferred embodiment, the VCSEL according to the invention is used with an external cavity. To this end, the first Bragg reflector is arranged directly below the second semiconducting layer, wherein the second Bragg reflector is spaced apart from the first semiconducting layer. Advantageously, the laser wavelength can be adjusted with a second Bragg reflector that is movable in this manner. If the second Bragg reflector is spaced from the first semiconducting layer, then the semiconducting layer is preferably protected by a dielectric layer which is preferably simultaneously used for adjusting the reflectivity at the surface of the semiconductor structure.

The VCSEL region can be pumped by one, two or more pump laser cavities.

Figure 2:
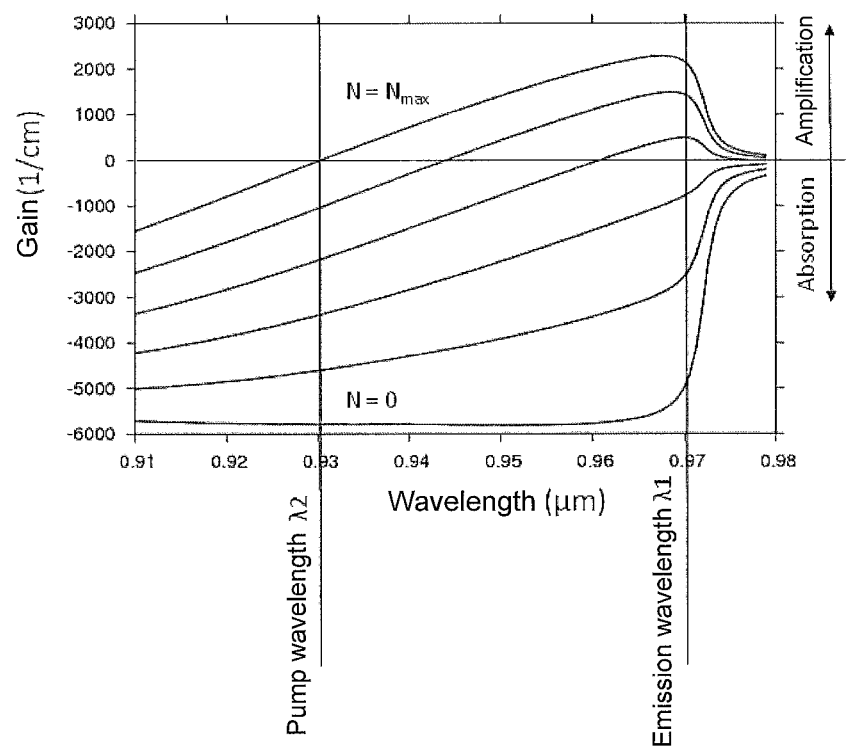
Figure 3:
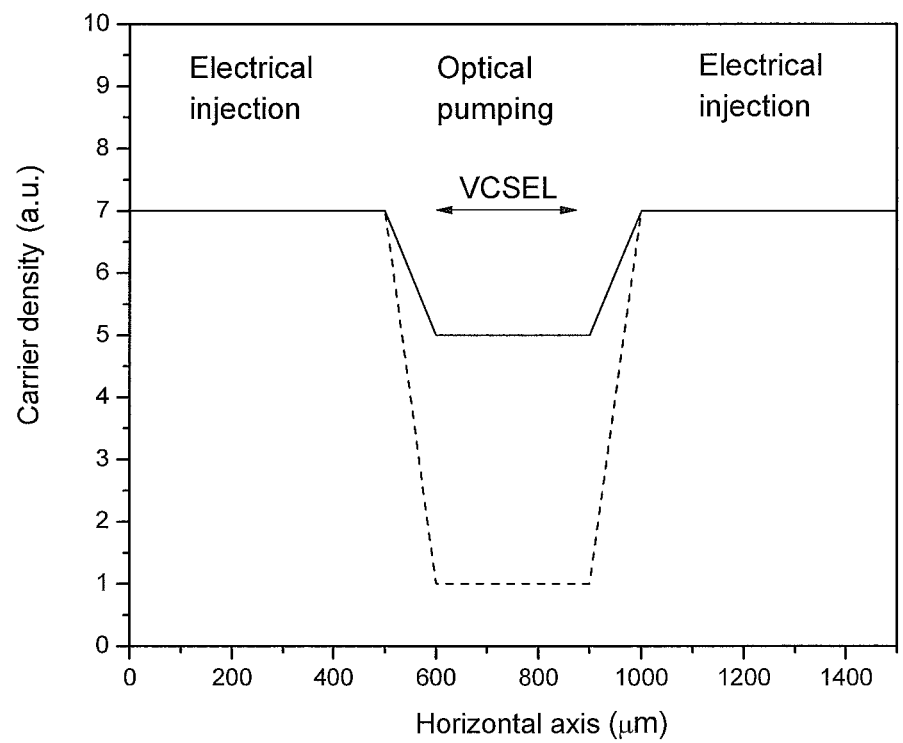
Figure 4:
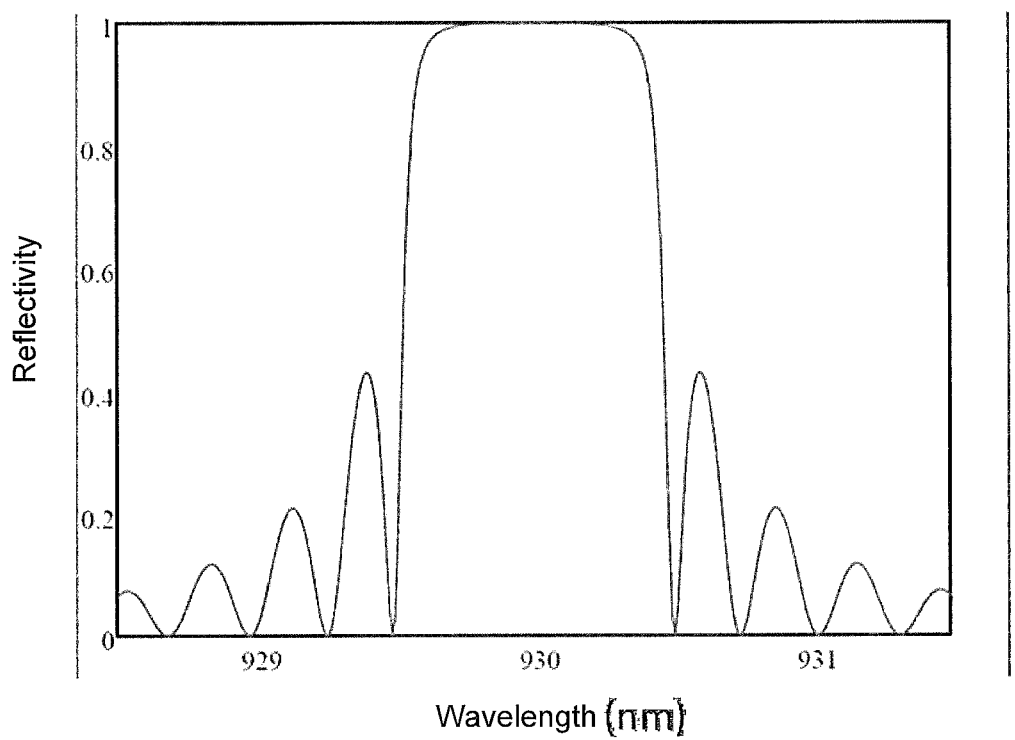
Figure 5:
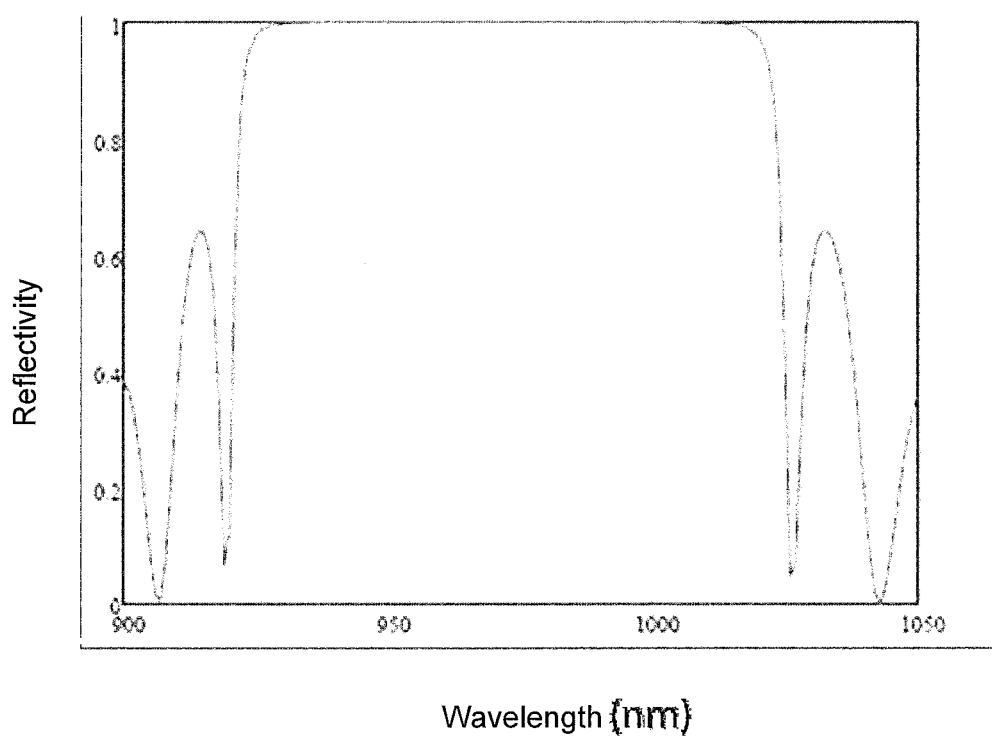
Figure 6:
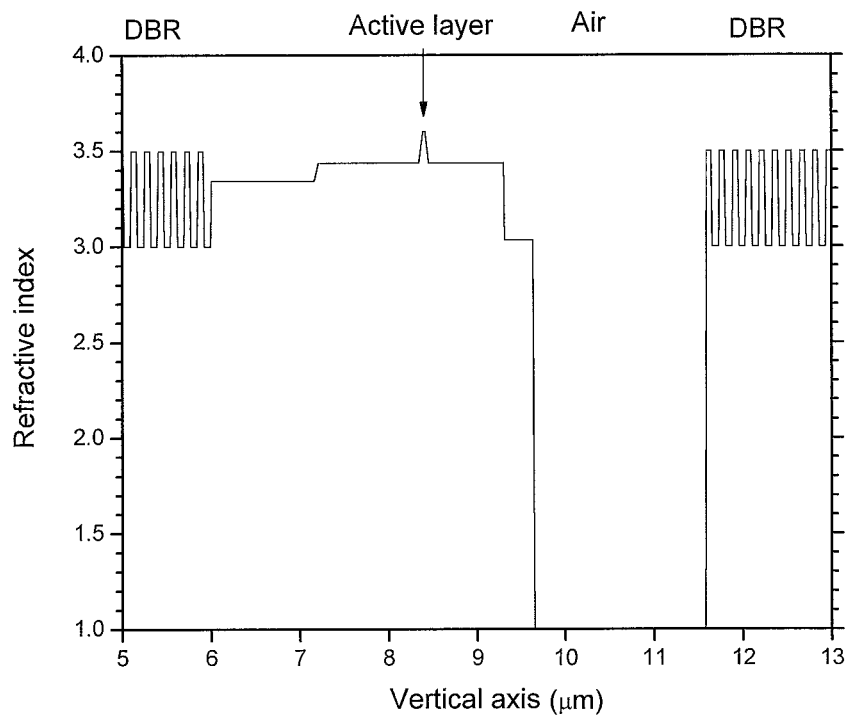
Figure 7:
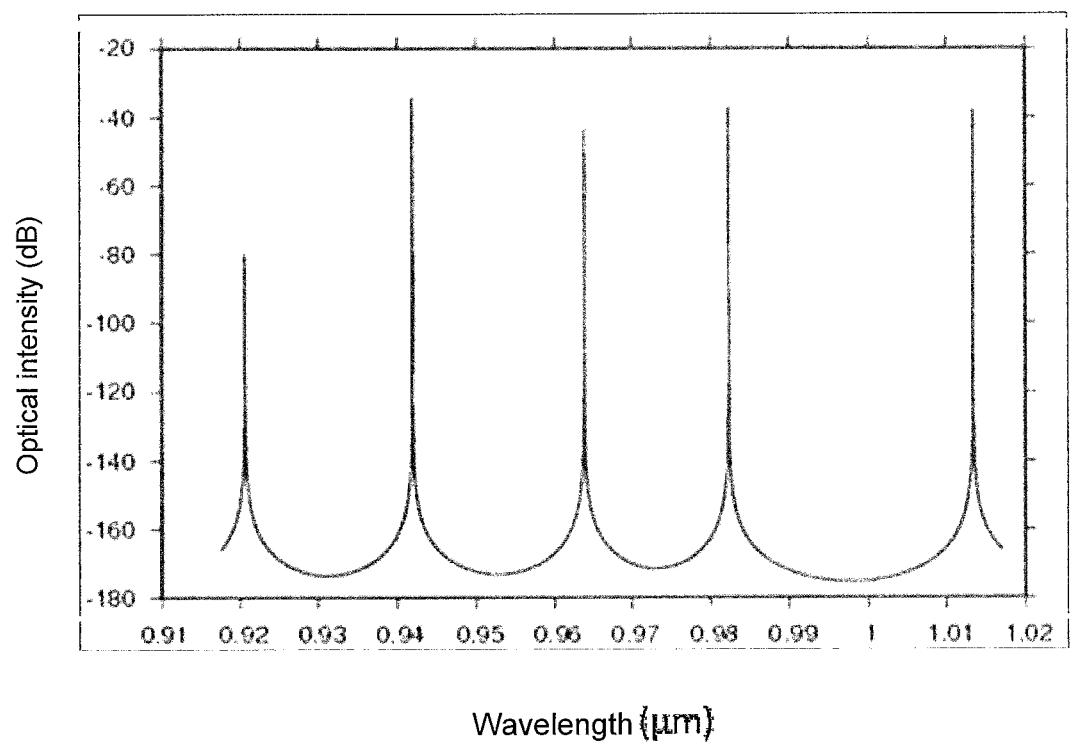
Figure 8:
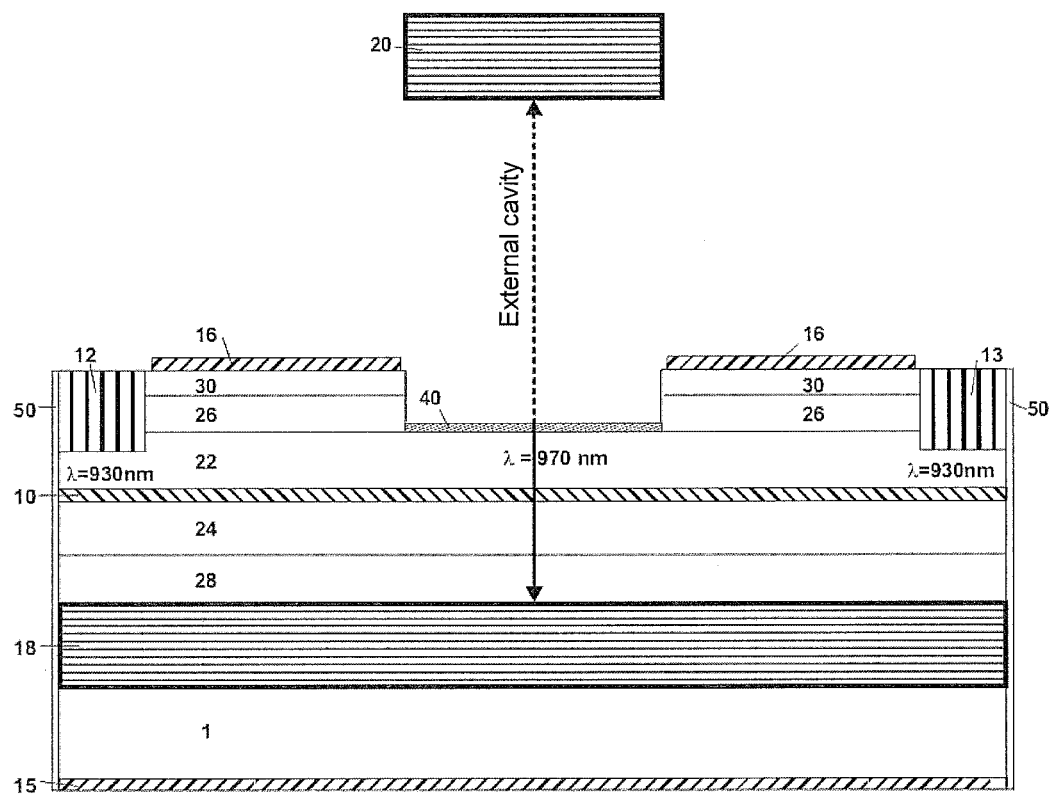
Figure 9:
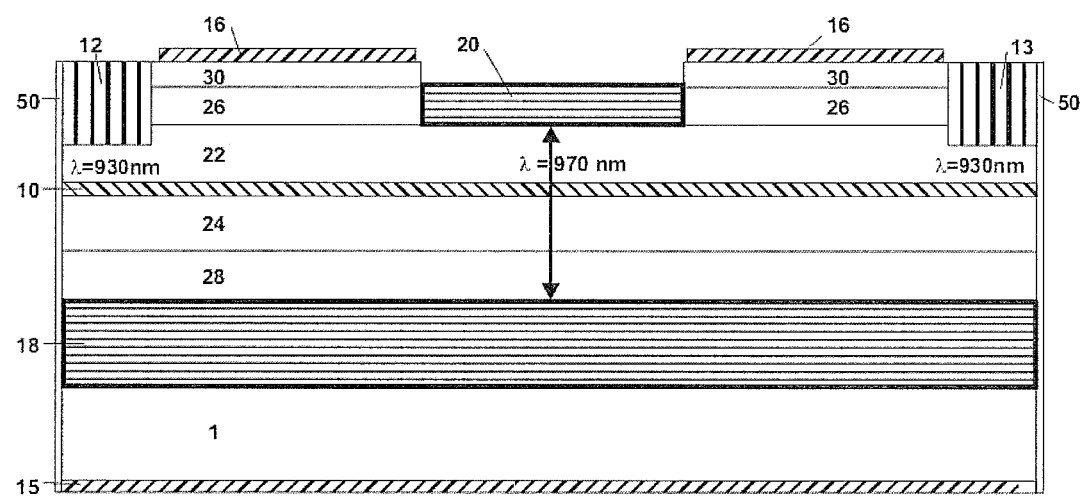
Figure 10:
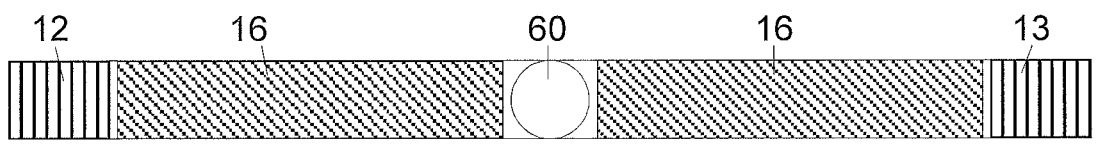
Figure 11:
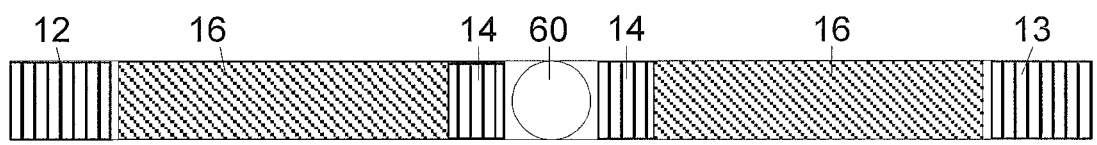
Figure 12:
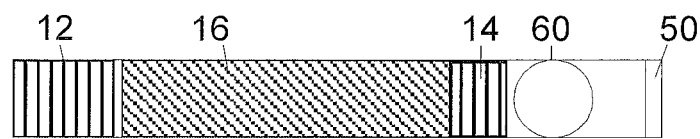
Figure 13:
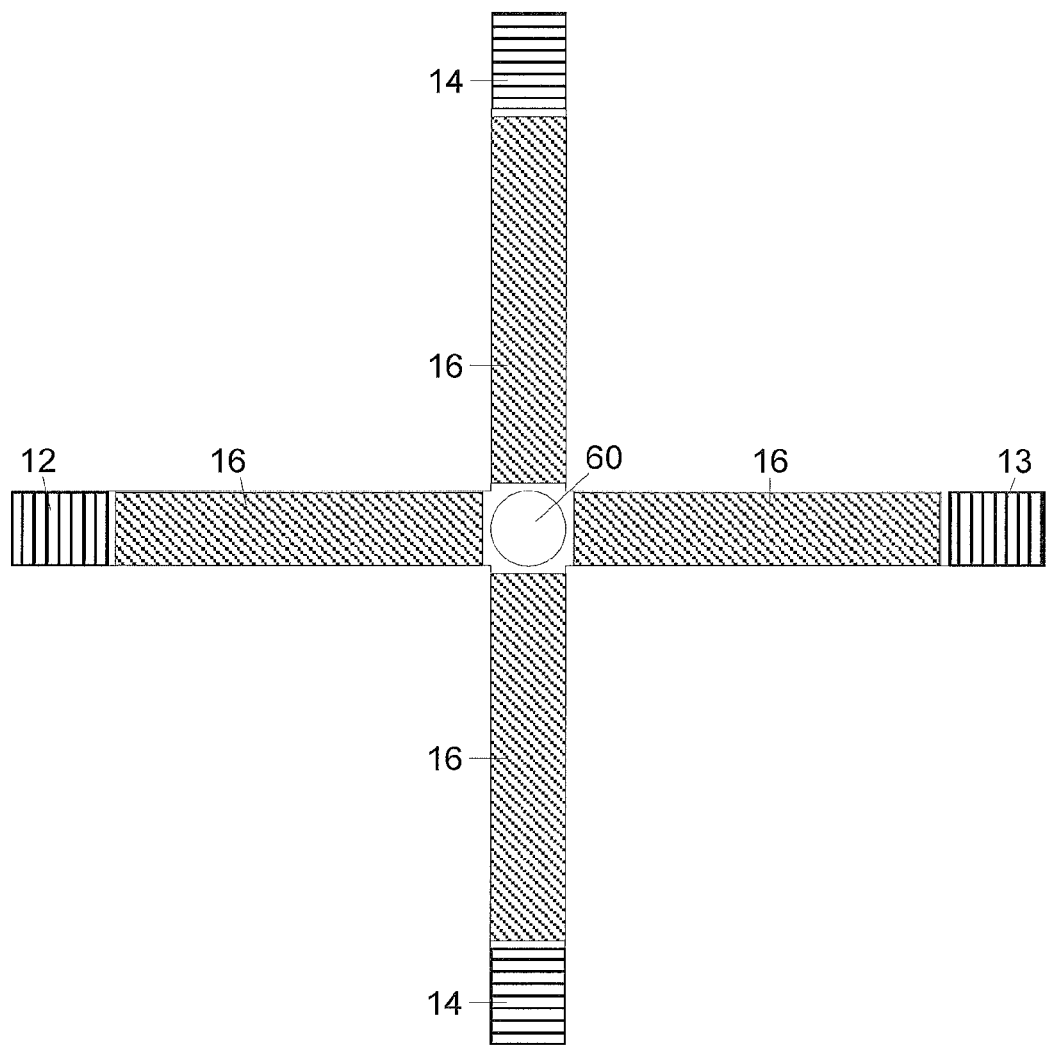

The invention will now be described in more detail with reference to exemplary embodiments illustrated in the Figures, wherein:

FIG. 1 shows a TCSEL according to the invention in a schematic cross-sectional diagram: exemplary embodiment TCSEL A, FIG. 2 a schematic diagram of the amplification profile of the VCSEL of FIG. 1 for different carrier densities in the active layer, FIG. 3 a schematic diagram of the carrier density in the active layer along the horizontal axis in FIG. 1 for low optical pump power (dashed) and high optical pump power (continuous line), FIG. 4 a schematic diagram of the reflectivity of the function of wavelength of the pump-DBR mirror of the TCSEL of FIG. 1, FIG. 5 a schematic diagram of the reflectivity as a function of the wavelength of the VCSEL-DBR mirror of the TCSEL of FIG. 1, FIG. 6 a schematic diagram of the refractive index profile of the VCSEL of FIG. 1 along the vertical axis, FIG. 7 a schematic diagram of the resonant optical modes of the vertical cavity, FIG. 8 a TCSEL according to the invention in a schematic cross-sectional diagram: exemplary embodiment TCSEL B, FIG. 9 a TCSEL according to the invention in a schematic cross-sectional diagram: exemplary embodiment TCSEL C, FIG. 10 a schematic diagram of an arrangement of a pump laser and a VCSEL, type 1, FIG. 11 a schematic diagram of an arrangement of a pump laser and a VCSEL, type 2, FIG. 12 a schematic diagram of an arrangement of a pump laser and a VCSEL, type 3, FIG. 13 a schematic diagram of an arrangement of a pump laser and a VCSEL, type 4.

FIG. 1 shows a cross-section of a TCSEL in the plane of the beam propagation in both cavities. The active medium 10 is delimited in the horizontal direction by the DBR regions 12 and 13 which form the resonator of the horizontal pump laser. The active medium 10 is arranged in the vertical direction between a first layer structure consisting of the semiconductor layers 22 and 26 and a second layer structure consisting of the semiconducting layers 24 and 28, wherein one of the layer structures is n-doped and the other p-doped. In the center region of the TCSEL, the layers 10, 22, 24, 26 and 28 are arranged between the vertical DBR-mirrors 18 and 20. In the adjacent regions, the semiconducting layers 10, 22, 24, 26 and 28 are arranged between electrical contact layers 16.

FIG. 2 shows a gain spectrum of the active layer in the central VCSEL region for different carrier densities N=0 ... $N_{max}$. Without pumping, i.e., without carriers (N=0), the active medium absorbs in the entire illustrated spectral wavelength range $\lambda$=910 ... 980 nm (negative gain). With increasing pump power and hence increasing carrier density N, a positive gain is produced initially in a narrow spectral range near $\lambda$=970 nm. The resonance wavelength (emission wavelength) of the vertical cavity shall be located at this first wavelength $\lambda 1$. The pump wavelength $\lambda 2$=930 nm should be shorter than λ1 so that the active medium continues to absorb pump power. Upon further increase of the pump power, the carrier density increases to the maximum value $N_{max}$, where pump power is no longer absorbed.

FIG. 3 shows schematically the horizontal profile of the carrier density in the active medium 10 for low optical pump power (dashed) and for high optical pump power (continuous line). The carriers are electrically injected into the lateral regions between the electric contacts 16. The carriers are optically excited (pumped) in the central VCSEL region. The carrier density in the VCSEL region increases with increasing optical pump power until the maximum value $N_{max}$ is reached. The carrier density in the electrically injected region is greater than $N_{max}$ and remains approximately constant as long as the pump laser is operated above its lasing threshold. Lateral carrier diffusion is negligible.

FIG. 4 shows the reflectivity spectrum of the horizontal Bragg reflectors 12 and 13 of the pump laser. The spectral width of the reflectivity band is very small (here about 1 nm) which is typical for horizontal DBR lasers. This narrow reflectivity band near the wavelength λ2=930 nm is a significant element of the invention, because horizontal reflection of the VCSEL light at λ1=970 nm is prevented.

FIG. 5 shows the reflectivity spectrum of the vertical Bragg reflectors 18 and 20 of the VCSEL. The reflectivity band is typically quite wide (here about 100 nm). The VCSEL wavelength λ1 can be adjusted by a vertical displacement of the movable DBR mirrors 20.

FIG. 6 shows the vertical profile of the refractive index in the central VCSEL region. The DBR mirrors 18 and 20 typically consist of two alternate materials having preferably quite different values of the refractive index. The resonance wavelength is determined by the optical distance between the two mirrors 18, 20. With increasing distance, the number of resonance wavelengths increases, i.e., several vertical optical modes may exist.

FIG. 7 shows schematically the spectrum of the vertical optical modes of the TCSEL. The mode (wavelength) with a positive optical gain is the laser mode (emission wavelength λ1—see FIG. 2).

FIG. 8 shows the cross-section in the plane of the beam propagation in both cavities of a second exemplary embodiment B of a TCSEL. In type B, the second Bragg mirror 20 is spaced apart, whereas the first Bragg mirror 18 is disposed on the semiconductor substrate 1 with the backside contact 15. Arranged above are the n-cladding layer 28, the n-waveguide layer 24, the active medium 10, the p-waveguide layer 22, the p-cladding layer 26 and the contact layer 30. The layers 22, 24, 26, 28 form the horizontal waveguide for the light having the pump wavelength. The third Bragg mirror 12 and the fourth Bragg mirror 13 extend across the layers 26, 30 and the upper region of layer 26. Additional dielectrically layers 50 are deposited on the planar edges of the semiconductor to adjust the reflectivity of the Bragg mirrors 12, 13. The vertical cavity is formed by the first Bragg mirror 18 and the spaced-apart second Bragg mirror 20. The layers 26 and 30 are removed in the region where the light exits. A protective dielectric coating (40) is deposited on the semiconductor surface in the light exit area.

FIG. 9 shows the cross-section in the plane of the beam propagation in both cavities of a second embodiment C of a TCSEL. In comparison to type B, type C is characterized in that the second Bragg mirror 20 replaces the protective dielectric coating. With a corresponding design of the first Bragg mirror 18, the first Bragg mirror 18 can replace the n-cladding layer 28.

FIGS. 10-13 schematically illustrate in form of top views four preferred pump configurations. In type 1 (FIG. 10) the VCSEL is arranged in the center of the pump laser cavity. Type 2 (FIG. 11) is different from type 1 in that additional DBR reflectors 14 are introduced at the transition pump laser-VCSEL in order to improve the stability of the laser mode in the pump resonator. In type 3 (FIG. 12), the VCSEL is pumped only from one side. In type 4 (FIG. 13), the VCSEL is located in a crossed cavity for increasing the pump power.

In the following, typical compositions for the preferably employed layers are listed:

1 Substrate: preferably n-GaAs
10 Active medium: preferably one to five 5-15 nm thick InGaAs quantum well layers in 5-20 nm thick GaAs barrier layers
12 Bragg reflector: grating etched in epitaxial layers
13 Bragg reflector: grating etched in epitaxial layers
14 Bragg reflector: grating etched in epitaxial layers
15 Electrical contact: layer sequence for producing a good ohmic contact
16 Electrical contact: layer sequence for producing a good ohmic contact
18 Bragg reflector: λ/4 layer sequence, preferably alternatingly arranged n-$Al_XGa_{1-X}As$ (X=0-0.5) and $Al_YGa_{1-Y}As$ (Y=0.6-1).
20 Bragg reflector: λ/4 layer sequence, preferably alternatingly arranged n-$Al_XGa_{1-X}As$ (X=0-0.5) and $Al_YGa_{1-Y}As$ (Y=0.6-1).
22 First semiconducting layer: preferably low p-doped 300-1000 nm AlGaAs with 20-50% Al fraction
24 Second semiconducting layer: preferably low n-doped 300-1000 nm AlGaAs with 20-50% Al fraction
26 Third semiconducting layer: preferably p-doped 500-1000 nm AlGaAs with 30-95% Al fraction
28 Fourth semiconducting layer: preferably n-doped 500-1000 nm AlGaAs with 30-95% Al fraction
30 Fifth semiconducting layer: preferably highly doped p-GaAs
40 Protective dielectric coating: preferably SiN The compound semiconductor layer structure is preferably fabricated by MBE (molecular beam epitaxy) or more preferably by MOVPE (metal-organic vapor phase epitaxy).

The third Bragg mirror and the fourth Bragg mirror are preferably fabricated by producing stripe-shaped varnish layers as etch masks using projection lithography, holographic lithography, electron beam lithography, or phase mask lithography. The semiconductor is preferably structured by etching with acids or more preferably with reactive ions (RIE: Reactive Ion Etching).

The light exit face in the TCSEL types B-C is preferably also opened by etching with acids or more preferably with reactive ions. Because with type C the etch depth determines the cavity length, an etch stop layer, preferably made of InGaP, can be introduced during epitaxy of the layers 22 and 26.

All other fabrication steps, such as preferably CVD (chemical vapor deposition) for dielectrics, electron beam evaporation for metal layers and the photolithography required for producing the structure correspond to the present state of the compound semiconductor technology.

The third Bragg mirror and the fourth Bragg mirror are preferably formed as surface gratings. Alternatively, the third Bragg mirror and the fourth Bragg mirror can also be formed as embedded gratings arranged closer to the active zone. However, this would increase the technical complexity.

LIST OF REFERENCES SYMBOLS

1 Substrate
10 Active medium
12 Bragg reflector
13 Bragg reflector
14 Bragg reflector
15 Electrical contact
16 Electrical contact
18 Bragg reflector
20 Bragg reflector
22 First semiconducting layer
24 Second semiconducting layer
26 Third semiconducting layer
28 Fourth semiconducting layer
30 Fifth semiconducting layer
40 Dielectric layer
50 Dielectric layer
60 Light exit opening

The invention claimed is:

1. Vertical-Cavity Surface-Emitting Laser with a stripe-shaped active medium having an emission maximum at a first wavelength, wherein a first reflector is arranged below the stripe-shaped active medium and a second reflector is arranged above the stripe-shaped active medium, with the first reflector facing the second reflector, wherein the first reflector and the second reflector have a maximum reflectivity in a region of the first wavelength, wherein
 a third reflector and a fourth reflector are each arranged on a side above or next to the stripe-shaped active medium, wherein the third reflector faces the fourth reflector, and wherein the third reflector and the fourth reflector have a maximum reflectivity in a region of a second wavelength, wherein the first wavelength is greater than the second wavelength, wherein
 the stripe-shaped active medium is uniformly formed over an entire area comprised between the third and the fourth reflectors, wherein
 the reflectors from the group: the first reflector, the second reflector, the third reflector and the fourth reflector are each constructed as a Bragg reflector, wherein
 the first reflector and the second reflector each have a reflectivity of greater than 99% for the first wavelength, the third reflector and the fourth reflector each have a reflectivity of greater than 60% for the second wavelength, and the reflectivity of the first reflector for the first wavelength is greater than the reflectivity of the second reflector for the first wavelength, and further wherein
 a width of reflection band of the first and second reflectors is about 100 nm at the first wavelength, a width of reflection band of the third and fourth reflectors is less than 10 nm at the second wavelength, and the reflection band of each reflector corresponds to a region where the reflectivity is greater than 50% of the maximum reflectivity at the respective wavelength.

2. Vertical-Cavity Surface-Emitting Laser according to claim 1, wherein
 the stripe-shaped active medium consists of a layer structure having a thickness between 5 nm and 100 nm and/or a length between 250 µm and 2 mm.

3. Vertical-Cavity Surface-Emitting Laser according to claim 1, wherein
 the stripe-shaped active medium has several identical or different layer structures with thicknesses between 5 nm and 100 nm and/or with a length between 250 µm and 2 mm.

4. Vertical-Cavity Surface-Emitting Laser according to claim 1, wherein
 the difference between the first wavelength and the second wavelength is between 10 nm and 200 nm.

5. Vertical-Cavity Surface-Emitting Laser according to claim 1, wherein
 the third reflector and the fourth reflector directly contact the stripe-shaped active medium.

6. Vertical-Cavity Surface-Emitting Laser according to claim 1, wherein
 the laser has exactly one stripe-shaped active medium.

7. Vertical-Cavity Surface-Emitting Laser according to claim 1, wherein
 the stripe-shaped active medium is arranged inside a first cavity between the first reflector and the second reflector.

8. Vertical-Cavity Surface-Emitting Laser according to claim 7, wherein
 the stripe-shaped active medium is arranged inside a second cavity between the third reflector and the fourth reflector, or that the third reflector and the fourth reflector are arranged above the stripe-shaped active medium to form a second cavity.

9. Vertical-Cavity Surface-Emitting Laser according to claim 1, wherein
 the stripe-shaped active medium directly contacts at its top surface a first semiconducting layer structure made of a semiconducting material and directly contacts at its bottom surface a second semiconducting layer structure made of a semiconducting material, wherein the first semiconducting layer structure has a doping of opposite polarity with respect to the second semiconducting layer structure.

10. Vertical-Cavity Surface-Emitting Laser according to claim 9, wherein
 the first reflector is disposed directly on the second semiconducting layer structure, wherein the second reflector is spaced apart from the first semiconducting layer structure to form a vertical external cavity.

11. Vertical-Cavity Surface-Emitting Laser according to claim 9, wherein
 at least one electric contact for injection of carriers is disposed on a side of the second semiconducting layer structure in a region on the side or below the first reflector.

12. Vertical-Cavity Surface-Emitting Laser according to claim 9, wherein
 at least one electric contact for injection of carriers is disposed on a side of the first semiconducting layer structure opposed to the side facing the active medium.

13. Vertical-Cavity Surface-Emitting Laser according to claim 9, wherein
 the third reflector and the fourth reflector each extend along an axis extending perpendicular with respect to a length of the first semiconducting layer structure.

14. Vertical-Cavity Surface-Emitting Laser according to claim 12, wherein
 the at least one electric contact for injection of carriers is provided on the first semiconducting layer structure in an entire electrically pumped region of the active medium, between the third reflector and the fourth reflector, but not in a region of the second reflector.

\* \* \* \* \*